US 6,710,633 B2

United States Patent
Da Dalt

(10) Patent No.: US 6,710,633 B2
(45) Date of Patent: Mar. 23, 2004

(54) METHOD AND ARRANGEMENT FOR FREQUENCY GENERATION

(75) Inventor: Nicola Da Dalt, Villach (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/206,410

(22) Filed: Jul. 26, 2002

(65) Prior Publication Data

US 2003/0043024 A1 Mar. 6, 2003

(30) Foreign Application Priority Data

Aug. 17, 2001 (DE) .......................... 101 40 485

(51) Int. Cl.[7] .................. H03K 21/00; H03K 23/00; H03K 25/00
(52) U.S. Cl. .................. 327/115; 327/117; 377/47; 377/48
(58) Field of Search ............. 377/47, 48; 327/113, 327/114, 115, 117

(56) References Cited

U.S. PATENT DOCUMENTS 6,115,442 A * 9/2000 Lusinchi ............... 377/47
6,281,721 B1 * 8/2001 Kinget et al. ........... 327/115
6,380,774 B2 * 4/2002 Saeki ................... 327/119

FOREIGN PATENT DOCUMENTS

JP 10-032486 2/1998

OTHER PUBLICATIONS

US2003/0068003 "switched phase dual–modulus prescaler circuit having means for reducing power consumption" by Casagrande , Apr. 10, 2003.*
Krishnapura, N, et al., *A 5.3–GHz Programmable Divider for HiPerLAN in 0.25–μm CMOS*, IEEE Journal of Solid–State Circuits, vol. 35, No. 7, Jul. 2000.

* cited by examiner

Primary Examiner—Tuan T. Lam
(74) Attorney, Agent, or Firm—Workman Nydegger

(57) ABSTRACT

To generate a target frequency from a basic frequency, a phased signal of the basic frequency and of a phase controllable by a phase clock signal is generated in accordance with the invention, the target frequency being generated by dividing the frequency of the phased signal by an output dividing factor and the phase clock signal being generated from the phased signal irrespective of the target frequency. A wider range of target frequencies can be obtained in this way. Also, the switching pattern in which the phase of the phased signal is changed can be made independent of the state of the phased signal, thus giving further possible ways of acting on the target frequency.

20 Claims, 2 Drawing Sheets

METHOD AND ARRANGEMENT FOR FREQUENCY GENERATION

BACKGROUND OF THE INVENTION

CROSS REFERENCE TO RELATED APPLICATIONS

The present application claims priority from German patent application Serial Number DE 101 40 485.9 filed Aug. 17, 2001 and entitled "Method and Arrangement for Frequency Generation" which application is incorporated herein by reference in its entirety.

THE FIELD OF THE INVENTION

The present invention relates to a method and an arrangement for generating a target frequency from a basic frequency, in which the target frequency is generated by dividing the frequency of a phased signal of the basic frequency by an output dividing factor, the phase of the phased signal being changed cyclically under the control of a phase clock signal.

BRIEF SUMMARY OF THE INVENTION

To generate a target frequency different from a basic frequency from the basic frequency concerned, it is known for the basic frequency to be divided by means of a frequency divider. If the basic frequency is to be divided in this case by a fractional dividing factor, it is not possible for simple synchronous or asynchronous flip-flop circuits to be used and instead different methods have to be employed. To produce a fractional dividing factor, it is for example known for the basic frequency alternately of a first number of cycles to be divided by a first whole-number dividing factor and of a second number of cycles to be divided by a second whole-number dividing factor. As a function of the ratio between the two dividing factors and between the first number of cycles and second number of cycles it is possible for a fractional dividing factor to be simulated in this way. However, this method does have the disadvantage that the output frequency is constantly hopping between two values which result from the first dividing factor and second dividing factor respectively and the target frequency is obtained only as a mean.

To overcome this disadvantage, it is also known for a fractional dividing factor to be obtained by generating a plurality of input phased signals of the basic frequency which are shifted relative to one another by a given phase shift, for one of these input phased signals to be switched forward by a selector circuit to become a phased signal and for its frequency to be divided by a whole-number dividing factor by means of an output divider, the selector circuit being so controlled by the output signal from the output divider that at each cycle of the output signal from the output divider it selects a different input phased signal and switches it forward to become the phased signal. In this way the switching of the output divider can be advanced or retarded by periods of time shorter that one cycle of the basic frequency, which gives a fractional dividing factor between the output frequency of the output divider and the basic frequency. It is known as well for the selector circuit to be driven in such a way that at each cycle of the target frequency it is not the input phased signal of the next higher or next lower phase that is selected and instead a certain number of next higher or next lower phases are skipped. In this way it is possible to obtain different target frequencies by way of the laws adopted for selecting the input phased signals. However, this method has the disadvantage that only one operation of switching between the input phased signals is possible at each cycle of the target frequency. This means that there is only a limited range of possible target frequencies and dividing factors The object underlying the present invention is to provide a method and an arrangement of the above kind for generating a target frequency from a basic frequency with which it is possible to obtain a wide range of dividing factors, and particularly fractional dividing factors, between the basic frequency and the target frequency. This method is achieved in accordance with the invention by a method having the features given in claim 1 and by an arrangement having the features given in claim 15.

In accordance with the invention, what is used in this case to generate the phase clock signal is not the output signal from the output divider but the phased signal itself. Because the phased signal has not yet been divided by the output dividing factor, it has more cycles per unit of time and thus provides more opportunities for the phase of the phased signal to be changed. It is for example possible in this way for a phase clock signal to be generated which clocks either at each cycle of the phased signal or only after a given number of cycles of the phase clock signal. Advantageously, a control means can preset in this case after how many cycles of the phased signal a clock pulse of the phase clock signal is to be produced.

To generate the phase clock signal from the phased signal, use may advantageously be made of a switch which switches the phased signal forward to become a phase clock signal and which is controlled by a switching signal. If a switch of this kind is constantly closed, the phase clock signal is the same as the phased signal, as a result of which the phase clock signal generates a clock pulse at each cycle of the phased signal. If the switch is opened for a cycle after every given number of cycles of the phased signal, the frequency of the phased signal can be divided in this way. At the same time it is also conceivable for the switch to be closed after every given number of cycles of the phased signal for a given second number of cycles of the phased signal, thus enlarging the scope for generating different controlling clock signals.

When changing the phase of the phased signal, it is possible for various phase states to be defined, with the phases of the phased signal in the various phase states being spaced apart from one another by a given amount. In particular, the phase states may be so selected in this case that the phases in the various phase states are regularly distributed within the length of one cycle of the basic frequency. To change the phase of the phased signal, the various phase states are set to cyclically one after the other so that the phase of the phased signal is advanced or retarded by a given amount at each change of phase state, depending on the sequence in which the phase states are set to. The amount by which the phase of the phased signal is advanced or retarded is equal to the phase difference between the individual phase states.

However, it is also conceivable in this case for individual phase states in the sequence of phase states which are set to be skipped so that the phase of the phased signal is advanced or retarded by a larger amount at each change of phase state. By acting on the sequence in which the phase states are set to, the number of target frequencies that are achievable can be enlarged in this way.

Advantageously, the sequence in which the phase states are set to, or in other words the pattern of change of the phase of the phased signal, is changed as a function of the phased signal. It this way it is possible to cause the phase of the phased signal to be changed not in a constant pattern but in a changing pattern. Since there can only be a finite number of phase states, there are only a limited number of possible ways of setting the phase states one after another. By means of a setting sequence dependent on the phased signal, it is for example possible on the one hand to cause the phase states to be changed cyclically in one direction alternately from one to the next and on the other for one phase state at a time to be skipped when this is done. However, it is also conceivable in this case for a change to be made between quite a large number of different patterns, in which case the individual patterns may be as desired. In this way it possible for the number of target frequencies achievable to be increased still further, this being achieved in particular even when there are only a small number of phase states or in other words possible ways of changing the phase of the phased signal.

To change the phase of the phased signal, or rather to set its phase state, use may on the one hand be made of known devices for changing the phase of a signal. Advantageously however, the phased signal of adjustable phase is generated from a plurality of input phased signals of the basic frequency, the input phased signals having different phase angles relative to one another. When this is the case, one of these input phased signals can be selected by means of a selector circuit and switched through to become the phased signal. The change in the phase of the phased signal is effected in this case by driving the selector circuit and switching through a given input phased signal.

When changing the phase of the phased signal, allowance is advantageously also made for the logic state that the phased signal will be in after its change as compared with its logic state before the change. If the two logic states in question are different, i.e. if the logic state of the phased signal changes when its phase is changed, this may cause a spurious pulse or glitch because the change in the logic state of the phased signal may affect the phase clock signal, which in turn may cause a further change in the phase of the phased signal. To stop this from happening, the logic state of the phased signal is not changed until the logic state of the phased signal after it has been changed will be the same as its logic state was when it was, as yet, unchanged.

To achieve this, an auxiliary phase circuit may be provided which generates an auxiliary phased signal of the basic frequency. This auxiliary phase circuit is driven in such a way that the phase of the auxiliary phased signal generated by it is in advance of the phase of the phased signal by one increment of the phase clock signal. At a given point in time, the auxiliary phased signal is thus in the logic state that the phased signal will be in after its next change. By comparing the auxiliary phased signal and the phased signal, it is possible for the phase clock signal to be retarded in such a way that a change in the phase of the phased signal does not take place until the change will not cause a change in the logic state of the phased signal. For this purpose, the phase clock signal may for example be switched by a switching function which only switches the phase clock signal through when the auxiliary phased signal is in the same logic state as the phased signal.

The invention is explained in detail below by reference to preferred embodiments and to the accompanying drawings.

These and other objects and features of the present invention will become more fully apparent from the following description and appended claims, or may be learned by the practice of the invention as set forth hereinafter.

BRIEF DESCRIPTION OF THE DRAWINGS

The invention is explained in detail below by reference to preferred embodiments and to the accompanying drawings.

Figure 1:
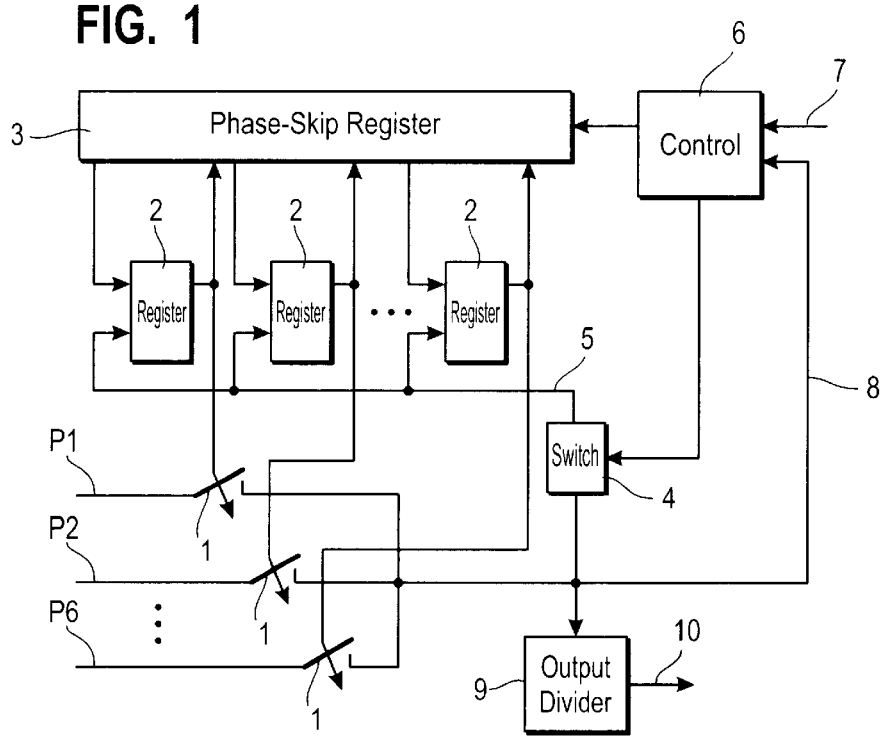
FIG. 1 shows the layout of a circuit arrangement for generating a target frequency from a basic frequency constituting a first embodiment of the present invention.

The circuit arrangement shown in FIG. 1 is used to generate an output signal 10 of a target frequency. What the circuit arrangement shown uses as input signals are a plurality of input phased signals P1–P6 which are all of the basic frequency at the time but have a certain difference in phase relative to one another. The waveforms of the input phased signals P1–P6 over time are shown in the top part of FIG. 2. From this it can be seen that the second input phased signal P2 lags behind the first input phased signal P1 by a small difference in phase. The same is true of the third input phased signal P3 relative to the second input phased signal P2 and of the rest of the input phased signals P4–P6. The phase difference between the last input phased signal P6 and the preceding fifth input phased signal P5 is the same, in terms of size, as that between it and the first input phased signal P1, which succeeds it however.

Each of these input phased signals P1–P6 can be switched through by a phase switch 1 to a common node at which there is a phased signal 8. The phase switches 1 are driven in such a way that only one phase switch 1 is closed and the input phased signal P1–P6 applied to it is switched through to become the phased signal 8. Because the phase angles of the input phased signals P1–P6 are regularly distributed within the length of one cycle of the basic frequency, it is possible in this way, by driving the phase switches 1, to cause the phase of the phased signal to be raised or lowered in given increments, with the increments being multiples of the phase difference between two successive phased signals P1 to P6.

For driving the phase switches 1, there are registers 2 provided which are clocked by a phase clock signal 5. The output of each register 2 is connected to an associated phase switch 1. The inputs and outputs of registers 2 are connected to a phase-skip register 3 which is used to lay down the sequence in which the phase switches 1 are actuated. For this purpose, the phase-skip register 3 is able, each time, to connect the outputs of registers 2 either to the inputs of the next registers 2 or to the inputs of the next but one registers 2.

Registers 2, together with the connections made between outputs of registers 2 and inputs of registers 2 in phase-skip register 3, thus form a looped shift register in which a switched state is shifted cyclically through registers 2 in a given sequence under the control of phase clock signal 5. The sequence is set in this case by phase-skip register 3 by making suitable connections between the outputs of registers 2 and the inputs of registers 2.

Phase clock signal 5 is connected to phased signal 8 via a switch 4. Switch 4 is driven by a control means 6 which is also connected to phase-skip register 3. Control means 6 is able on the one hand to act on phase clock signal 5 by driving switch 4 and on the other to set the sequence in which registers 2 switch each other by controlling phase-skip register 3. If switch 4 is closed, phased signal 8 is switched through to become the phase clock signal 5. If switch 4 is driven under clocked control, it is only a given number of the clock pulses in phased signal 8 which are switched through each time to become the phase clock signal 5, thus enabling the frequency of phase clock signal 5 to be equal to that of phased signal 8 as a maximum or to be lower than it.

Because the outputs of registers 2 also control phase switches 1, the sequence in which registers 2 are switched also affects the phase of phased signal 8.

To set the circuit arrangement to different modes, control means 6 may have applied to it a control signal 7 which can be used to act on the target frequency of the output signal 10. Output signal 10 is finally generated by dividing the frequency of phased signal 8 by means of an output divider 9.

By means of control signal 7, control means 6 can be caused to close switch 4 only at every second clock pulse of phased signal 8, thus making the frequency of phase clock signal 5 half as large as that of phased signal 8 in this mode. The output dividing factor of output divider 9 is 2 in the embodiment shown.

The two possible sequences in which phase switches 1 are switched can each be run through in two different directions and can also be set to alternate. Two different frequencies can be set for phase clock signal 5.

Figure 2:
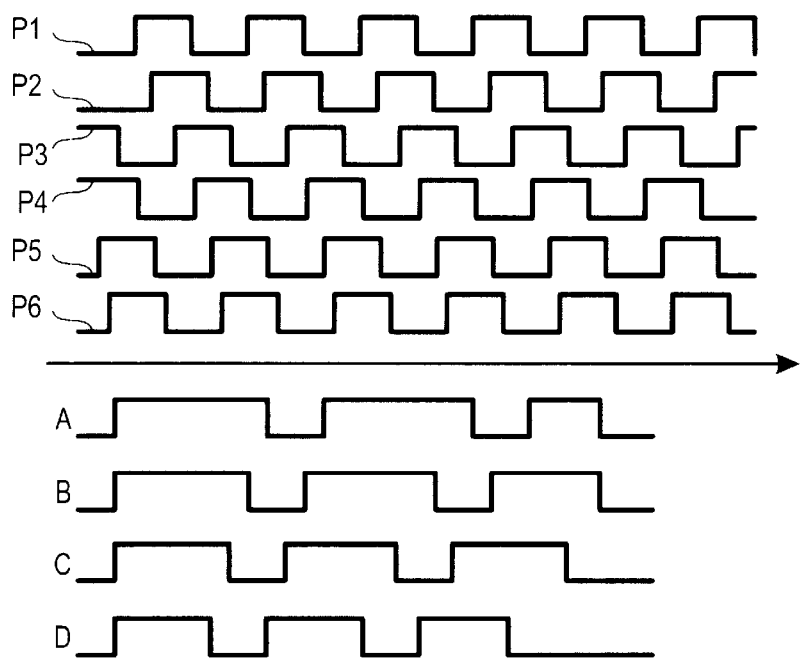
FIG. 2 shows the waveforms of the input signals and output signals of the circuit arrangement shown in FIG. 1 in different modes.

At the bottom of FIG. 2 are shown the waveforms of output signal 10 in four different modes A–D, plotted against time. In the four modes A–D shown, the input phased signals P1–P6 are switched through in the direction represented by the sequence P6, P5, P4 . . . , thus allowing the phase of many cycles of phased signal 8 and thus the switching of output divider 9 to be advanced. In this way it is possible to obtain a dividing factor which is fractional and is smaller than the dividing factor of 2 which is the output dividing factor of output divider 9.

In what follows the signal waveforms will be referred to by the same letters as their associated modes A∝D. All four signal waveforms A–D begin with a change from 0 to 1 which is triggered by the first positive-going edge of the sixth input phased signal P6. The subsequent changes of state in signals A–D, and particularly the times at which they take place, are determined by the mode A–D at the time and produce different cycle lengths and hence frequencies for the output signal 10.

In the case of the waveforms of the input phased signals P1–P6 shown in FIG. 2, the positive-going edges which, in one of modes A–D, cause output signal 10 to switch from 0 to 1 and thus produce a positive-going edge in output signal 10 are marked by being shown as heavier lines.

The first changeover from 0 to 1 in signals A–D is caused by the first marked edge of the sixth input phased signal P6, because it was at this time that the phase switches 1 switched the sixth input phased signal P6 through to become phased signal 8. The subsequent switching sequences depend on the mode A–D at the time.

In mode A the phase clock signal 5 is the same as the output signal 10. This being so, switch 4 is only closed at every second cycle of phased signal 8, thus making the frequency of phase clock signal 5 half that of phased signal 8. The sequence in which registers 2 are switched remains constant, a switch being made in this mode A from one input phased signal P1–P6 to the input phased signal P1 to P6 which is next in advance at each pulse of phase clock signal 5.

In mode A, a switch is made at the first marked edge of the sixth input phased signal P6 to the fifth input phased signal P5, the frequency of the phase clock signal being half that of phased signal 8, which means that the next change from 0 to 1 in output signal A only takes place at the second successive positive-going edge in the fifth input phased signal P5, i.e. the first marked edge in the fifth phased signal P5. In the present switching process it is the fourth input phased signal P4 which is selected next, thus causing the next change from 0 to 1 in output signal A to be produced, once again, after two positive-going edges of the fourth input phased signal P4. Hence the length of a cycle of output signal A is twice the cycle length of the basic frequency less 1/8th of the cycle length of the basic frequency. In this mode the basic frequency is divided by a dividing factor of 2 less 1/8th.

In mode B, switch 4 is closed continuously. The frequency of phase clock signal 5 is thus the same as that of phased signal 8 and twice that of output signal 10. The sequence in which phase switches 1 are switched is the same as in the previous mode A, which means that at each pulse of phase clock signal 5 a switch forward is made to the input phased signal P1–P6 which is leading by 1/16th of the cycle length of the basic frequency. The result is a dividing factor of 2 minus 2/16ths.

In mode C, switch 4 is closed continuously, thus causing a pulse of phase clock signal 5 to be generated at each cycle of phased signal 8. However, the sequence in which phase switches 1 are switched is controlled dynamically in this case in such a way that one input phased signal P1–P6 is skipped at each pulse of phase clock signal 5 and that a switch is made to that input phased signal P1–P6 which leads the one currently switched through by 2/16th of the cycle length of the basic frequency, provided the output signal 10 is logic 0. If the output signal is logic 1, phase switches 1 are so controlled that, as in mode B, a switch is made at each pulse of phase clock signal 5 to that input phased signal P1–P6 which is leading by 1/16th of the cycle length of the basic frequency. The result is a dividing factor of 2 less 3/16ths.

In mode D, switch 4 is once again continuously closed, thus causing each pulse of phased signal 8 to generate a pulse of phase clock signal 5. The sequence in which phase switches 1 are switched is unchanged, with one input phased signal P1–P6 being skipped at each pulse of phase clock signal 5 and that input phased signal P1–P6 being switched through to become phased signal 8 which is leading that currently switched through by 2/16th of the cycle length of the basic frequency. The result is a dividing factor of 2 minus 4/16ths.

The direction in which phase switches 1 are switched can be reversed in all four of these modes A–D, thus enabling a total of eight modes to be run with the circuit arrangement shown. With the direction of switching of phase switches 1 reversed, dividing factors of 2 plus 1/16th, 2 plus 2/16ths, 2 plus 3/16ths and 2 plus 4/16ths can be obtained with modes A–D.

Figure 3:
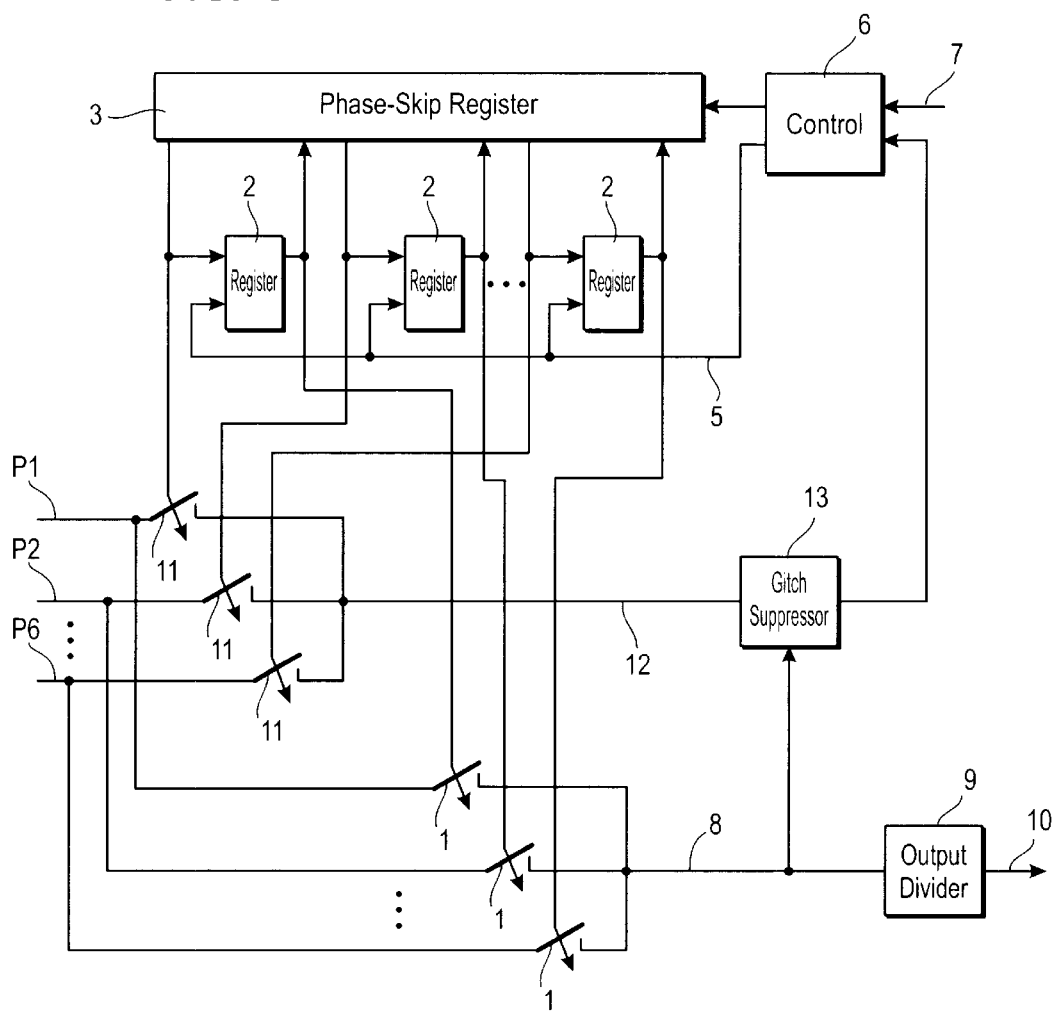
FIG. 3 shows the layout of a circuit arrangement for generating a target frequency from a basic frequency constituting a second embodiment of the present invention.

In FIG. 3 is shown a second embodiment of the circuit arrangement according to the present invention. In this second embodiment of the circuit arrangement there are provided, in addition to the circuit arrangement shown in FIG. 1, a series of auxiliary phase switches 11 which are also connected to respective ones of the input phased signals P1 to P6 and are able to switch them through to a common node. At this node there is an auxiliary phased signal 12. However, unlike phase switches 1, auxiliary phase switches 11 are controlled not by the outputs of registers 2 but by the signals which are applied to the inputs of registers 2. At a given point in time, it is therefore always that auxiliary phase switch 11 which is driven whose associated phase switch 1 will be driven by the next pulse of phase clock signal 5. The switched state of auxiliary phase switches 1 therefore leads that of phase switches 1 by one increment of phase clock signal 5.

Phase clock signal 5 is generated directly by control means 6 in this case, it being generated in line with the modes as it was in the case of the first embodiment of circuit arrangement.

DETAILED DESCRIPTION OF EXEMPLARY EMBODIMENTS

In the present embodiment, there is also a glitch suppressing means 13 provided which receives both auxiliary phased signal 12 and phased signal 8 as input signals and whose output is connected to control means 6. Glitch suppressing means 13 sets a logic AND condition between phased signal 8 and auxiliary phased signal 12 and directs the result to control means 6. Control means 6 uses the output signal from glitch suppressing means 13 to generate the phase clock signal 5 from it in the same way as it used phased signal 8 in the previous embodiment.

Glitch suppressing means 13 is so designed in this case that it only sets a logic AND condition between auxiliary phased signal 12 and phased signal 8 when the sequence in which phase switches 1 are switched envisages input phased signals P1 to P6 whose phases are lagging being switched through. Otherwise, i.e. when auxiliary phase input signals P1–P6 of leading phase are being switched through, glitch suppressing means 13 loops phased signal 8 through to control means 6, thus producing the same situation as exists in the circuit arrangement shown in FIG. 1.

Where there is a switching sequence in which switches are made to input phased signals P1–P6 of lagging phase, the occurrence of spurious pulses in phased signal 8 is prevented by means of glitch suppressing means 13. The reason is that in an input phased signals P1–P6 of lagging phase the signal edges necessary occur at later points in time and hence, when a switch is made to this input phased signal P1–P6, there will again be a signal edge arriving only shortly after the switch. To avoid this, the glitch suppressing means 13 and the AND condition applied in it cause a change from 0 to 1 or from 1 to 0 in phased signal 8 only to reach control means 6 if the same change has taken place in auxiliary phased signal 12. In this way control means 6 does not generate the pulse of phase clock signal 5 to shift registers 2 forward unless phased signal 8 and auxiliary phased signal 12 are in the same logic state. This effectively suppresses the occurrence of spurious pulses.

What is claimed and desired to be secured by United States Letters Patent is:

1. A method of generating a target frequency from a basic frequency, the method comprising:

generating, independently of the target frequency, a phase clock signal based upon a phased signal;

changing, cyclically, the phase of the phased signal, the changing of the phase of the phased signal being controlled by the phase clock signal; and dividing the frequency of the phased signal by an output dividing factor to obtain the target frequency, the frequency of the phased signal being the basic frequency.

2. The method as recited in claim 1, wherein generating the phase clock signal comprises:

generating a switching signal from the phased signal; and switching the phased signal under the control of the switching signal.

3. The method as recited in claim 2, wherein the switching signal is generated from the phased signal as a function of a control signal for acting on the target frequency.

4. The method as recited in claim 2, wherein generating the switching signal comprises dividing the frequency of the phased signal by a phase-control dividing factor.

5. The method as recited in claim 4, wherein the phase-control dividing factor is set as a function of a control signal for acting on the target frequency.

6. The method as recited in claim 1, wherein generating the phase clock signal comprises dividing the frequency of the phased signal by a phase-control dividing factor.

7. The method as recited in claim 1, wherein changing the phase of the phased signal comprises:

selecting one phase input signal (P1–P6) from a plurality of phase input signals (P1–P6) of the basic frequency, the phase input signals (P1–P6) being of different phases; and using the selected phase input signal as the phased signal.

8. The method as recited in claim 7, further comprising distributing, regularly, the phases of the phase input signals (P1–P6) within the length of one cycle of the basic frequency.

9. The method as recited in claim 1, further comprising changing the phase of the phased signal in a periodic switching sequence which is set by a control signal for acting on the target frequency.

10. The method as recited in claim 1, further comprising altering the phase of the phased signal in a periodic switching sequence which is altered by a logic state of the phased signal.

11. The method as recited in claim 1, further comprising raising or lowering the phase of the phased signal by a given amount at each increment of the phase clock signal.

12. The method as recited in claim 11, wherein the phase of the phased signal is raised or lowered by a total of, at most, one cycle length of the basic frequency, the phase of the phased signal being raised or lowered by one complete cycle length of the basic frequency as soon as the phase of the phased signal overruns the limits set by the cycle length when raised or lowered.

13. The method as recited in claim 1, wherein the phase of the phased signal is not changed unless a logic state of the phased signal will be the same before and after any change to the phased signal.

14. The method as recited in claim 13, further comprising generating an auxiliary phased signal which is of the basic frequency and whose phase leads the phase of the phased signal by one increment of the phase clock signal, the phase of the phased signal only being changed when logic states of the phased signal and the auxiliary phased signal are the same.

15. The method as recited in claim 13, wherein the target frequency is only calculated where, at the time of the change in the phase of the phased signal, a logic state of the phased signal will be different before and after any change to the phased signal.

16. A system suitable for use in generating a target frequency based upon a basic frequency, the system comprising:

a control means which serves to generate a phase clock signal from a phased signal, irrespective of the target frequency;

a phase switching arrangement for changing the phase of the phased signal cyclically as a function of the phase clock signal; and an output divider for dividing the frequency of the phased signal of the basic frequency by an output dividing factor.

17. The system as recited in claim 16, further comprising a switch which can be driven by the control means by way of a switching signal, the switch being configured to generate the phase clock signal by switching the phased signal.

18. The system as recited in claim 16, wherein the control means acts as a phase frequency divider between the phased signal and the phase clock signal.

19. The system as recited in claim 16, further comprising a selector circuit for selecting the phased signal from a plurality of input phased signals (P1–P6).

20. The system as recited in claim 16, further comprising an auxiliary phase circuit for generating an auxiliary phased signal of the basic frequency, wherein the phase of the auxiliary phased signal leads the phase of the phased signal by one increment of the phase clock signal, and the phase of the phased signal is only changed if logic states of the phased signal and the auxiliary phased signal are the same.

* * * * *

UNITED STATES PATENT AND TRADEMARK OFFICE
CERTIFICATE OF CORRECTION

PATENT NO.    : 6,710,633 B2  
DATED         : March 23, 2004  
INVENTOR(S)   : Nicola Da Dalt It is certified that error appears in the above-identified patent and that said Letters Patent is hereby corrected as shown below:

Drawings,
Sheet 2 of 2, FIG. 3, Item 13, change "Gitch Suppressor" to -- Glitch Suppressor --

Column 2,
Line 52, before "cyclically" remove "to"

Column 3,
Line 2, change "It" to -- In --
Line 14, change "it possible" to -- it is possible --

Column 5,
Line 38, change "AαD." to -- A-D. --

Column 6,
Lines 21 and 36, change "1/16$^{th}$" to -- 1/6$^{th}$ --
Line 23, change "2/16$^{ths}$" to -- 2/6$^{ths}$ --
Lines 31 and 47, change "2/16$^{th}$" to -- 2/6$^{th}$ --
Lines 39 and 55, change "3/16$^{ths}$" to -- 3/6$^{ths}$ --
Line 49, change "4/16$^{ths}$" to -- 4/6$^{ths}$ --
Line 54, change "1/16$^{th}$, 2 plus 2/16$^{ths}$," to -- 1/6$^{th}$, 2 plus 2/6$^{ths}$, --

Signed and Sealed this

First Day of June, 2004

JON W. DUDAS  
*Acting Director of the United States Patent and Trademark Office*